United States Patent
Chen (10) Patent No.: US 11,721,383 B2
(45) Date of Patent: Aug. 8, 2023

(54) REFRESH CIRCUIT AND REFRESH METHOD OF A SEMICONDUCTOR MEMORY HAVING A SIGNAL GENERATION MODULE CONFIGURED TO GENERATE AN INVERSION SIGNAL AND CARRY SIGNALS BASED ON A REFRESH COMMAND; AN ADJUSTMENT UNIT TO GENERATE AN INVERSION ADJUSTMENT SIGNAL ACCORDING TO THE INVERSION

(71) Applicant: CHANGXIN MEMORY TECHNOLOGIES, INC., Hefei (CN)

(72) Inventor: Jixing Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 6 days.

(21) Appl. No.: 17/658,287

(22) Filed: Apr. 7, 2022

(65) Prior Publication Data

US 2023/0120815 A1  Apr. 20, 2023

(30) Foreign Application Priority Data

Oct. 18, 2021 (CN) .......................... 202111210522.0

(51) Int. Cl.
*G11C 11/406* (2006.01)
*H03K 3/0233* (2006.01)
*G11C 11/4093* (2006.01)

(52) U.S. Cl.
CPC .... *G11C 11/40615* (2013.01); *G11C 11/4093* (2013.01); *G11C 11/40618* (2013.01); *H03K 3/0233* (2013.01)

(58) Field of Classification Search
CPC ........ G11C 11/40615; G11C 11/40618; G11C 11/4093
USPC ....................................................... 365/222
See application file for complete search history.

(56) References Cited

U.S. PATENT DOCUMENTS

| 9,916,885 B2* | 3/2018 | Lee ........................... G11C 8/10 |
| 2007/0230264 A1* | 10/2007 | Eto ........................ G11C 11/406 365/222 |
| 2023/0039810 A1* | 2/2023 | Chen ................. G11C 11/40622 |

FOREIGN PATENT DOCUMENTS

CN           207489475 U      6/2018

* cited by examiner

*Primary Examiner* — Connie C Yoha
(74) *Attorney, Agent, or Firm* — Cooper Legal Group, LLC (57) ABSTRACT

A refresh circuit includes: a signal generation module, configured to generate an inversion signal and a carry signal based on a refresh command; an adjustment unit, configured to generate, if a first refresh signal and a second refresh signal are generated based on the refresh command, an inversion adjustment signal according to the inversion signal, and generate, if only the first refresh signal is generated based on the refresh command, the inversion adjustment signal according to an inversion signal corresponding to a first refresh signal generated based on a current refresh command, and generate the inversion adjustment signal only according to an inversion signal corresponding to a second refresh signal generated based on a next refresh command; and a counting module, configured to generate a first output signal and a second output signal, and invert the first output signal based on the inversion adjustment signal.

15 Claims, 5 Drawing Sheets

REFRESH CIRCUIT AND REFRESH METHOD OF A SEMICONDUCTOR MEMORY HAVING A SIGNAL GENERATION MODULE CONFIGURED TO GENERATE AN INVERSION SIGNAL AND CARRY SIGNALS BASED ON A REFRESH COMMAND; AN ADJUSTMENT UNIT TO GENERATE AN INVERSION ADJUSTMENT SIGNAL ACCORDING TO THE INVERSION

CROSS-REFERENCE TO RELATED APPLICATIONS

This application claims the priority of Chinese Patent Application No. 202111210522.0, submitted to the Chinese Intellectual Property Office on Oct. 18, 2021, the disclosure of which is incorporated herein in its entirety by reference.

TECHNICAL FIELD

The present disclosure relates to the field of semiconductor circuit design, and in particular, to a refresh circuit, a fresh method and a semiconductor memory.

BACKGROUND

With the rapid acceleration of capacities and speeds of semiconductor memories widely used in electronic devices, the power consumption of the semiconductor memories is constantly being increased.

Dynamic random access memory (DRAM) is a volatile semiconductor memory that stores data through charges in the capacitor. As the charges in the capacitor may leak in various manners over time, the data retention characteristic of the DRAM is restricted. In order to resolve the restricted data retention, it is normal that the DRAM periodically refreshes the data in the DRAM to charge or discharge the capacitor.

However, whether a refresh counter has a reliable count will directly affect the refresh operation.

SUMMARY

Embodiments of the present disclosure provide a refresh circuit, a fresh method and a semiconductor memory.

An embodiment of the present disclosure provides a refresh circuit, including: a signal generation module, configured to generate an inversion signal and a carry signal based on a refresh command, wherein the refresh command is used to sequentially generate a first refresh signal and a second refresh signal, the first refresh signal and the second refresh signal each generate the inversion signal, and the carry signal is generated based on the second refresh signal; an adjustment unit, configured to generate, if the first refresh signal and the second refresh signal are generated based on the refresh command, an inversion adjustment signal according to the inversion signal, and generate, if only the first refresh signal is generated based on the refresh command, the inversion adjustment signal according to an inversion signal corresponding to a first refresh signal generated based on a current refresh command, and generate the inversion adjustment signal only according to an inversion signal corresponding to a second refresh signal generated based on a next refresh command; and a counting module, configured to generate a first output signal and a second output signal, invert the first output signal based on the inversion adjustment signal, and cumulatively add the second output signal based on the carry signal, wherein data with the second output signal as a high order and the first output signal as a low order is used to characterize a refresh count based on the refresh command.

The refresh circuit uses the adjustment unit to adjust the time sequence when the second refresh signal is missing. As the second refresh signal of the first refresh command is missing, the refresh circuit only generates the inversion adjustment signal according to the inversion signal corresponding to the second refresh signal for the second refresh command, namely there are one effective carry signal in the first refresh command and the second refresh command, and two effective inversion signals (inversion adjustment signals) to form the refresh process of a normal refresh command, thereby correcting the inversion process of the first output signal and the counting process of the second output signal, and correcting the count of the third output signal.

An embodiment of the present disclosure further provides a refresh method, applied to the above refresh circuit, and including: receiving the refresh command, wherein the refresh command is used to sequentially generate the first refresh signal and the second refresh signal; generating the inversion signal based on the first refresh signal, generating the inversion signal based on the second refresh signal, and generating the carry signal based on the second refresh signal; generating the inversion adjustment signal based on the inversion signal; and inverting the first output signal based on the inversion adjustment signal, and cumulatively adding the second output signal based on the carry signal, wherein the data with the second output signal as the high order and the first output signal as the low order is used to characterize the refresh count based on the refresh command.

As the second refresh signal of the first refresh command is missing, the refresh method only generates the inversion adjustment signal according to the inversion signal corresponding to the second refresh signal for the second refresh command, namely there are one effective carry signal in the first refresh command and the second refresh command, and two effective inversion signals (inversion adjustment signals) to form the refresh process of a normal refresh command, thereby correcting the inversion process of the first output signal and the counting process of the second output signal, and correcting the count of the third output signal.

An embodiment of the present disclosure further provides a semiconductor memory, including the refresh circuit described above.

DETAILED DESCRIPTION

DRAM is a volatile semiconductor memory that stores data through charges in the capacitor. As the charges in the capacitor may leak in various manners over time, the data retention characteristic of the DRAM is restricted. In order to resolve the restricted data retention, it is normal that the DRAM periodically refreshes the data in the DRAM to charge or discharge the capacitor.

However, whether a refresh counter has a reliable count will directly affect the refresh operation.

Embodiments of the present disclosure provide a refresh circuit, to realize an accurate refresh count in a multi-pulse refresh.

Those of ordinary skill in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 1:
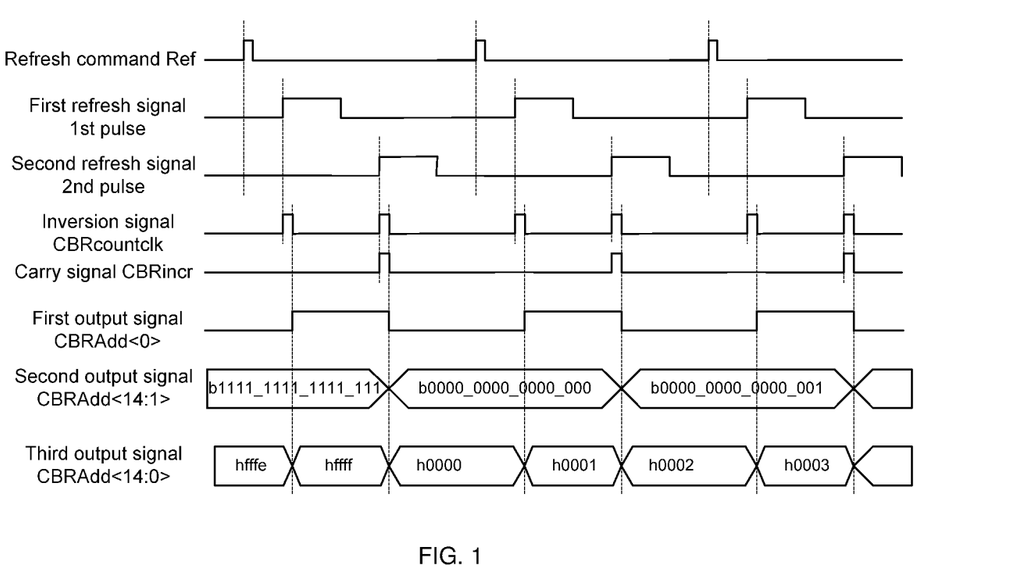
FIG. 1 is a schematic diagram of a refresh time sequence of a refresh circuit in a normal refresh according to an embodiment of the present disclosure.
Figure 2:
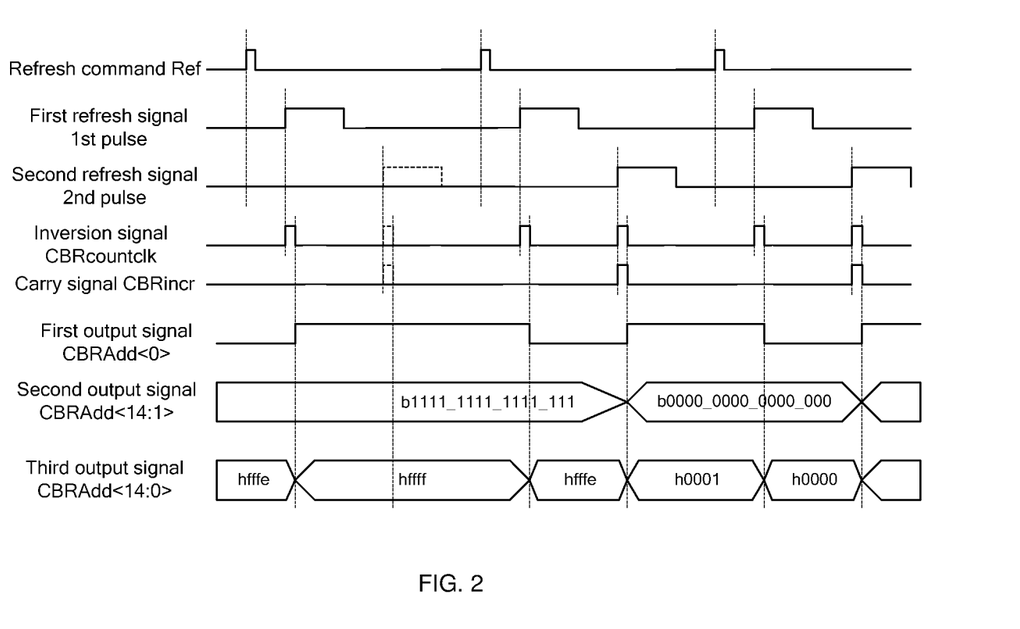
FIG. 2 is a schematic diagram of a refresh time sequence of a refresh circuit after missing of a second refresh signal according to an embodiment of the present disclosure.
Figure 3:
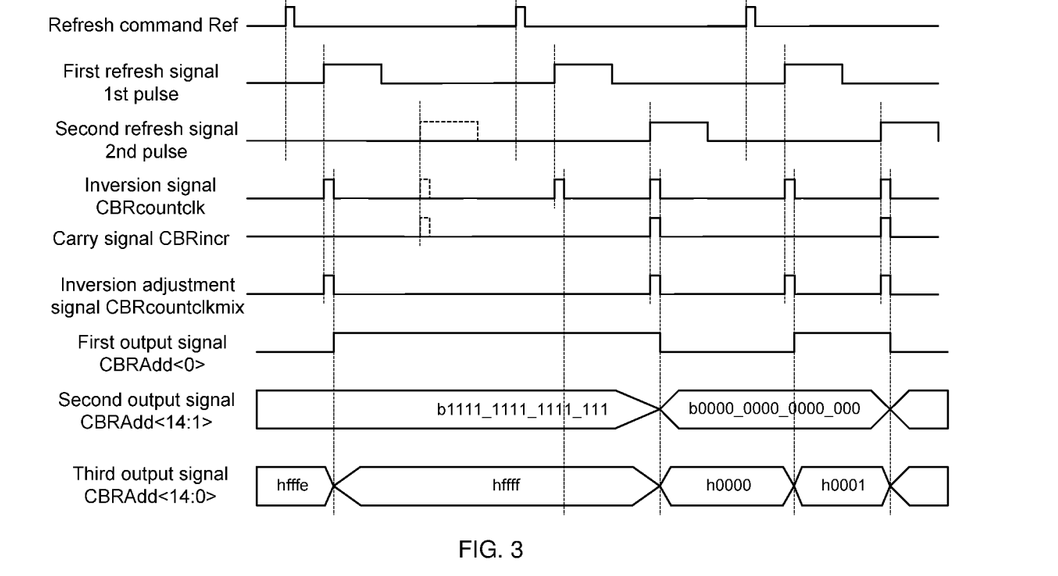
FIG. 3 is a schematic diagram of a refresh time sequence of a refresh circuit after adjustment of a newly added adjustment unit and missing of a second refresh signal according to an embodiment of the present disclosure.

The refresh in the embodiments of the present disclosure refers to a two pulse refresh, in which each refresh command generates two refresh signals. Referring to FIGS. 1-3, each refresh command Ref generates two refresh signals, namely a first refresh signal (1st pulse) and a second refresh signal (2nd pulse). A refresh operation is executed correspondingly once for each of the refresh signals, that is, a row address is refreshed.

In some embodiments, the refresh command is directed at a given bank. For example, the given bank may include eight banks. In response to an all bank refresh operation on the given bank, none of the eight banks in the given bank can be accessed. The wait time of the all bank refresh operation is a constant value. For example, the wait time of the all bank refresh operation may be 130 ns. The wait time may also be multiple clock cycles. It is to be noted that the semiconductor memory may include any number of banks.

In some embodiments, the wait time of the per bank refresh operation is usually less than that of the all bank refresh operation. In a specific example, the wait time of the per bank refresh operation may be 60 ns. One bank in the eight banks is being refreshed and inaccessible, but other seven banks may be accessible. In a specific example, the bank controller may execute the per bank refresh operation when determining that the predicted wait time of the given bank is less than the wait time of the all bank refresh operation.

When the refresh operation is performed on the semiconductor memory, a refresh counter for counting a refresh address is provided in the semiconductor memory. Particularly in the two pulse refresh, each refresh command generates two refresh signals, namely two refresh addresses are to be used by the refresh command. The two refresh addresses herein are row addresses of the bank. As the refresh signals each correspond to one refresh address, the counting on the refresh addresses may also be understood as the counting on the refresh signals.

For the all bank refresh command in the two pulse refresh, as each refresh signal refreshes all banks at the same time, the refresh counter adds 1 whenever the refresh is performed according to the refresh signal, to ensure all refresh addresses can be refreshed. However, for the per bank refresh command, the refresh signal is only effective to the belonging bank, and the carry condition of the refresh counter is that each refresh address is traversed by all banks, so the carry of the refresh counter does not like the all bank refresh operation that adds 1 whenever the refresh is performed according to the refresh signal. For example, if the refresh counter has a start address of 0000, and three all bank refresh operations are executed consecutively, the address change of the refresh counter is described as 0000->0001->0002->0003->0004->0005. However, if three per bank refresh operations are executed consecutively, the address change of the refresh counter is described as 0000->0001->0000->0001->0000->0001 . . . . The refresh counter cannot be carried to 0002 until addresses 0000 and 0001 are refreshed by all banks.

Figure 4:
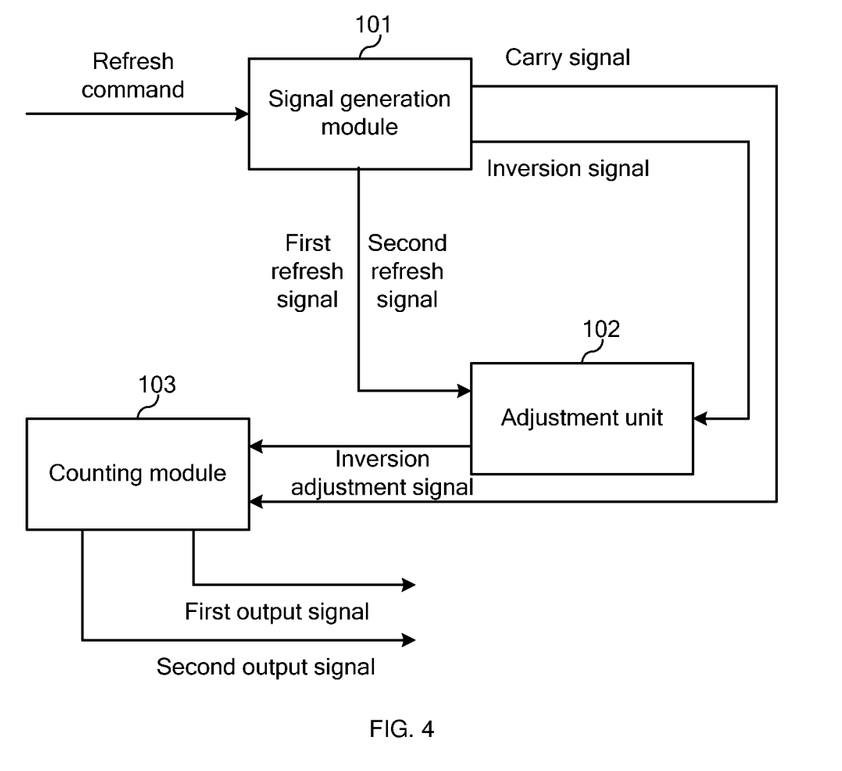
FIG. 4 is a structural schematic diagram of a refresh circuit according to an embodiment of the present disclosure.
Figure 5:
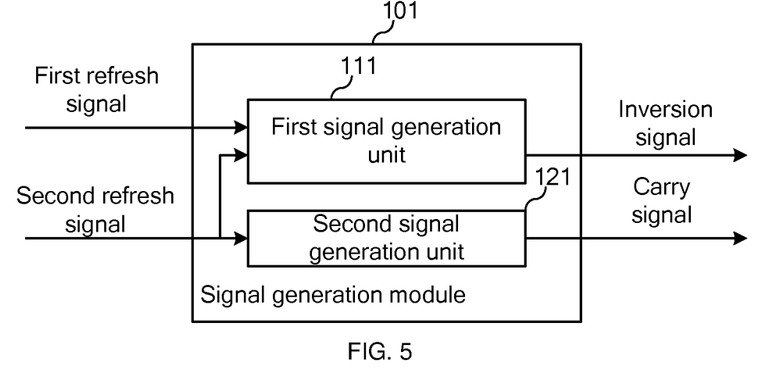
FIG. 5 is a structural schematic diagram of a signal generation module according to an embodiment of the present disclosure.
Figure 6:
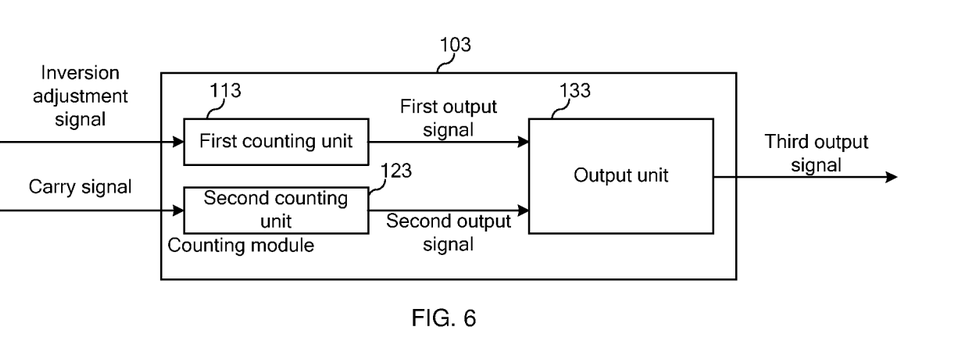
FIG. 6 is a structural schematic diagram of a counting module according to an embodiment of the present disclosure.
Figure 7:
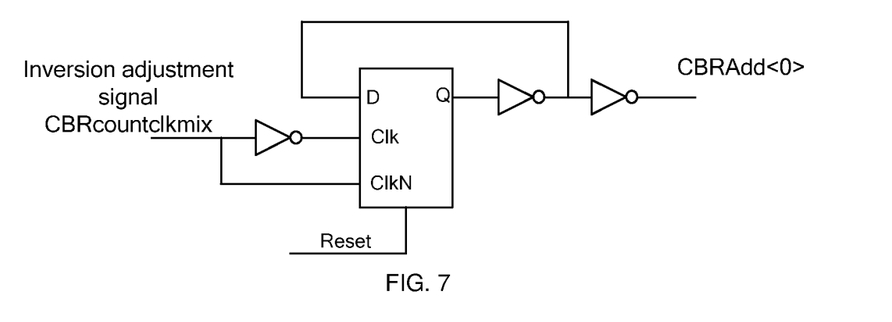
FIG. 7 is a structural schematic diagram of a first counting unit according to an embodiment of the present disclosure.
Figure 8:
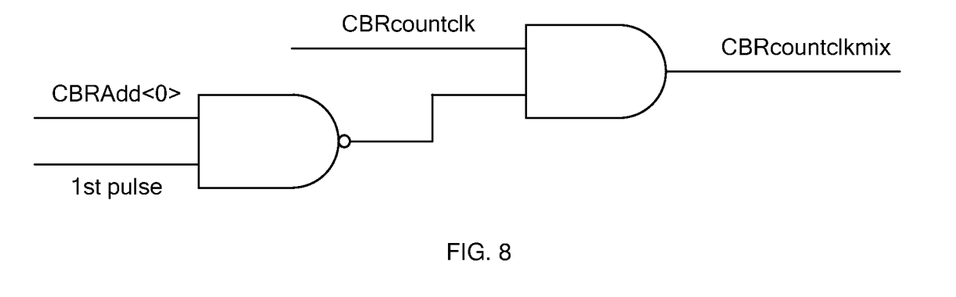
FIG. 8 is a structural schematic diagram of an adjustment unit according to an embodiment of the present disclosure.
Figure 9:
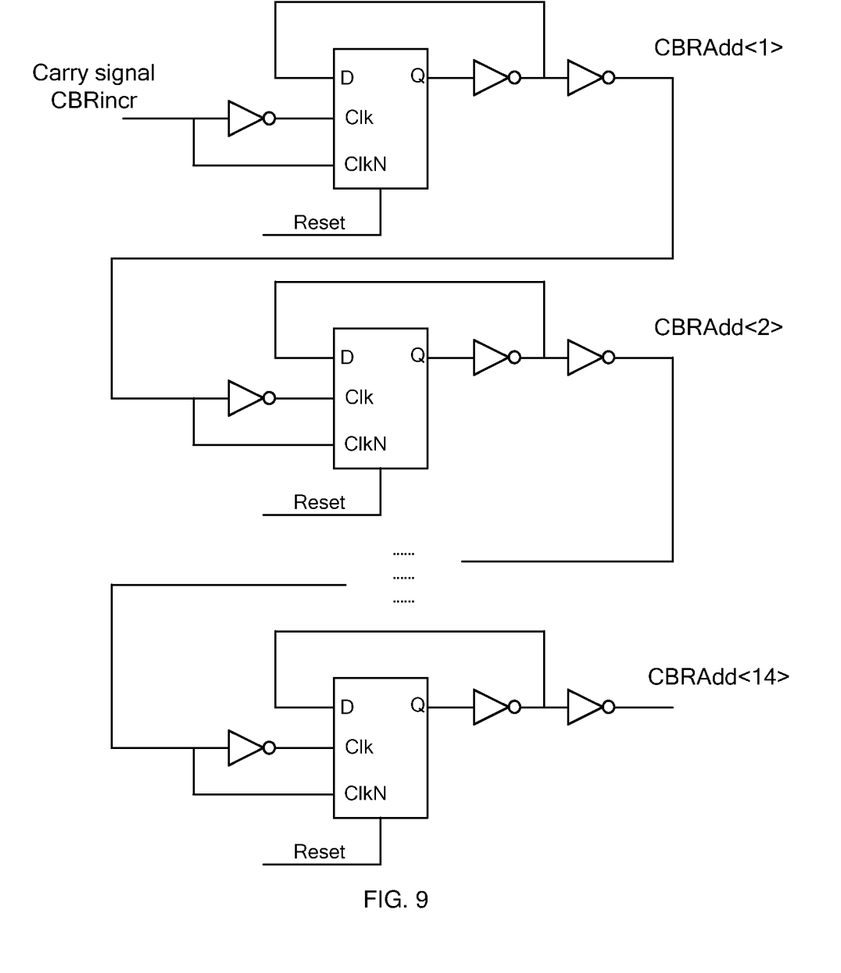
FIG. 9 is a structural schematic diagram of a second counting unit according to an embodiment of the present disclosure.

FIG. 1 is a schematic diagram of a refresh time sequence of a refresh circuit in a normal refresh according to an embodiment of the present disclosure. FIG. 2 is a schematic diagram of a refresh time sequence of a refresh circuit after missing of a second refresh signal according to an embodiment of the present disclosure. FIG. 3 is a schematic diagram of a refresh time sequence of a refresh circuit after adjustment of a newly added adjustment unit and missing of a second refresh signal according to an embodiment of the present disclosure. FIG. 4 is a structural schematic diagram of a refresh circuit according to an embodiment of the present disclosure. FIG. 5 is a structural schematic diagram of a signal generation module according to an embodiment of the present disclosure. FIG. 6 is a structural schematic diagram of a counting module according to an embodiment of the present disclosure. FIG. 7 is a structural schematic diagram of a first counting unit according to an embodiment of the present disclosure. FIG. 8 is a structural schematic diagram of an adjustment unit according to an embodiment of the present disclosure. FIG. 9 is a structural schematic diagram of a second counting unit according to an embodiment of the present disclosure. The refresh circuit provided in the embodiment is further described below in detail in conjunction with the accompanying drawings:

Referring to FIG. 4, the refresh circuit includes: a signal generation module 101, an adjustment unit 102, and a counting module 103.

The signal generation module 101 is configured to generate an inversion signal CBRcountclk and a carry signal CBRincr based on a refresh command Ref, where the refresh command Ref is configured to sequentially generate a first refresh signal (1st pulse) and a second refresh signal (2nd pulse), the first refresh signal (1st pulse) and the second refresh signal (2nd pulse) each generate the inversion signal CBRcountclk, and the carry signal CBRincr is generated based on the second refresh signal (2nd pulse).

The adjustment unit 102 is configured to generate, if the first refresh signal (1st pulse) and the second refresh signal (2nd pulse) are generated based on the refresh command Ref, an inversion adjustment signal CBRcountclkmix according to the inversion signal CBRcountclk; and generate, if only the first refresh signal (1st pulse) is generated based on the refresh command, the inversion adjustment signal according to an inversion signal CBRcountclk corresponding to a first refresh signal (1st pulse) generated based on a current refresh command Ref, and generate the inversion adjustment signal CBRcountclkmix only according to an inversion signal CBRcountclk corresponding to a second refresh signal (2nd pulse) generated based on a next refresh command Ref.

The counting module 103 generates a first output signal CBRAdd<0> and a second output signal CBRAdd<14:1>. The counting module 103 is configured to invert the first output signal CBRAdd<0> based on the inversion adjustment signal CBRcountclkmix, and cumulatively add the second output signal CBRAdd<14:1> based on the carry signal CBRincr. Data with the second output signal CBRAdd<14:1> as a high order and the first output signal CBRAdd<0> as a low order is used to characterize a refresh count based on the refresh command Ref.

It is to be noted that the data with the second output signal CBRAdd<14:1> as the high order and the first output signal CBRAdd<0> as the low order is used as a third output signal CBRAdd<14:0> for specific descriptions in the embodiment.

FIGS. 1-3 illustrate counting principles of the above refresh circuit. Referring to FIG. 1, if both the first refresh signal (1st pulse) and the second refresh signal (2nd pulse) generated based on the refresh command Ref exist, the inversion signal CBRcountclk and the carry signal CBRincr are normally generated. As both the first refresh signal (1st pulse) and the second refresh signal (2nd pulse) exist, the time sequence of the inversion adjustment signal CBRcountclkmix (not shown in FIG. 1) generated by the adjustment unit 102 is the same as that of the inversion signal CBRcountclk. In this case, the first output signal CBRAdd<0> is normally generated based on the inversion adjustment signal CBRcountclkmix, the second output signal CBRAdd<14:1> is normally counted based on the carry signal, and the generated third output signal can be hopped to a correct address.

However, in actual applications, the first refresh signal (1st pulse) is triggered according to the refresh command Ref with a small missing possibility, while the second refresh signal (2nd pulse) is generated according to internal circuits and may be missing due to some external reasons. Referring to FIG. 2, when the second refresh signal (2nd pulse) generated based on a refresh command Ref is missing, the carry signal CBRincr and the inversion signal CBRcountclk are generated in the time sequence of the first refresh command Ref due to missing of the second refresh signal (2nd pulse). In this case, if the inversion signal CBRcountclk is directly synchronized to the inversion adjustment signal CBRcountclkmix (not shown in FIG. 2), there is one inversion process missing for the generated first output signal CBRAdd<0>, resulting in that all subsequent first output signals CBRAdd<0> are wrong. Meanwhile, there is one carry process missing for the second output signal CBRAdd<14:1>, resulting in that the third output signal CBRAdd<14:0> is miscounted, and the third output signal CBRAdd<14:0> cannot characterize the refresh count based on the refresh command Ref.

The present disclosure uses the adjustment unit 102 (referring to FIG. 4) to adjust the time sequence when the second refresh signal (2nd pulse) is missing. Referring to FIG. 3, as the second refresh signal (2nd pulse) of the first refresh command Ref is missing, the present disclosure only generates the inversion adjustment signal CBRcountclkmix according to the inversion signal CBRcountclk corresponding to the second refresh signal (2nd pulse) for the second refresh command, namely there are one effective carry signal CBRincr in the first refresh command Ref and the second refresh command Ref, and two effective inversion signals CBRcountclk (inversion adjustment signals CBRcountclkmix) to form the refresh process of a normal refresh command Ref, thereby correcting the inversion process of the first output signal CBRAdd<0> and the counting process of the second output signal CBRAdd<14:1>, and correcting the count of the third output signal CBRAdd<14:0>.

In the embodiment of the present disclosure, the refresh command is an all bank refresh command or a per bank refresh command. The refresh signal generated based on the all bank refresh command is used to refresh all banks at the same time, specifically, refresh same row addresses of all banks. The refresh signal generated based on the per bank refresh command is used to refresh all banks one by one before repetition of the refresh on any bank, specifically, refresh row addresses of the all banks one by one.

It is to be noted that when the per bank refresh operation is executed for the per bank refresh command, all banks are refreshed via the per bank refresh command before repetition of the refresh on any bank. In other words, the per bank refresh operation is a non-repetitive one-to-one refresh operation for all banks. Herein, for the per bank refresh command, the refresh sequence of all banks in the one-to-one refresh process may be adjusted according to actual needs.

It is further to be noted that the all banks are all given banks to which the refresh command is directed, rather than all banks in the semiconductor memory. The all banks are the all banks in the semiconductor memory only when given banks to which the refresh command is directed are the all banks in the semiconductor memory.

In some embodiments, referring to FIG. 5, the signal generation module 101 includes: a first signal generation unit 111 and a second signal generation unit 121. The first signal generation unit 111 is configured to generate the inversion signal CBRcountclk according to the first refresh signal (1st pulse) and the second refresh signal (2nd pulse). The second signal generation unit 121 is configured to generate the carry signal CBRincr according to the second refresh signal (2nd pulse).

In some embodiments, referring to FIG. 6, the counting module 103 includes: a first counting unit 113, a second counting unit 123 and an output unit 133. The first counting unit 113 is configured to generate the first output signal CBRAdd<0>, and invert the first output signal CBRAdd<0> based on the inversion adjustment signal CBRcountclkmix. The second counting unit 123 is configured to generate the second output signal CBRAdd<14:1>, and cumulatively add the second output signal CBRAdd<14:1> based on the carry signal CBRincr. The output unit 133 is connected to the first counting unit 113 and the second counting unit 123, and configured to output a third output signal CBRAdd<14:0> according to the first output signal CBRAdd<0> and the second output signal CBRAdd<14:1>.

In an example, the first counting unit 113 (referring to FIG. 6) is specifically configured to: output a digital high-level signal or a digital low-level signal. Whenever receiving the inversion adjustment signal CBRcountclkmix, the first counting unit 113 (referring to FIG. 6) performs signal inversion once on a level of a digital high-level signal or digital low-level signal currently output by the first counting unit 113 (referring to FIG. 6) (referring to FIGS. 1-3). That is, the first counting unit 113 performs the signal inversion between the signal 1 and the signal 0 according to the inversion adjustment signal CBRcountclkmix.

Specifically, referring to FIG. 7, the first counting unit 113 (referring to FIG. 6) includes: a flip-flop and multiple inverters. An output port Q of the flip-flop is connected to an input terminal of an inverter. An output terminal of the inverter is connected to an input port D of the flip-flop. A clock port ClkN of the flip-flop is configured to receive the inversion adjustment signal CBRcountclkmix. The output port Q of the flip-flop is configured to output the first output signal CBRAdd<0>.

The first counting unit 113 has the following working principles: When a falling edge of the inversion adjustment signal CBRcountclkmix arrives, the flip-flop is triggered to transmit data of the input port D to the output port Q. As the data of the input port D and the data of the output port Q are inverted signals from each other before the flip-flop is triggered, the output signal from the output port Q of the flip-flop is inverted after the flip-flop is triggered by the inversion adjustment signal CBRcountclkmix.

Similarly, referring to FIG. 9, the second counting unit 123 (referring to FIG. 6) includes multiple flip-flops and multiple inverters. An output port Q of a low-order flip-flop is connected to a clock port ClkN of a high-order flip-flop. An output port Q of each the flip-flop is respectively connected to an input terminal of a inverter. An output terminal of the inverter is respectively connected to input ports D of the flip-flops. A clock port ClkN of a lowest-order flip-flop is configured to receive the carry signal CBRincr. The output port Q of each the flip-flop is jointly configured to output the second output signal CBRAdd<14:1>.

It is to be noted that the flip-flops in the second counting unit 123 each output one bit in the second output signal CBRAdd<14:1>, such as CBRAdd<1>, CBRAdd<2>, CBRAdd<3> . . . CBRAdd<14>. Data respectively output from the flip-flops are combined into the second output signal CBRAdd<14:1>.

The second counting unit 123 has the following working principles: When a falling edge of the carry signal CBRincr arrives, the low-order flip-flop is triggered to transmit data of the input port D to the output port Q. As the input data of the input port D and the output data of the output port Q are inverted signals from each other before the flip-flop is triggered, the output signal from the output port Q of the flip-flop is inverted after the flip-flop is triggered by the carry signal CBRincr. That is, the low-order flip-flop implements the output hopping from "1 to 0" or "0 to 1" based on the carry signal CBRincr. When the low-order flip-flop hops from "1 to 0", the high-order flip-flop is triggered by the output signal to transmit the data of the input port D to the output port Q. As the input data of the input port D and the output data of the output port Q are inverted signals from each other, the carry operation of binary data from the low order to the high order is implemented.

In the two pulse refresh in the embodiment of the present disclosure, the second counting unit 123 performs the counting according to the carry signal CBRincr, and the carry signal CBRincr is generated according to the second refresh signal (2nd pulse) generated based on the received refresh command Ref. Similarly, in the multi-pulse refresh, the CBRincr is generated according to a last refresh signal generated based on the received refresh command Ref. In either case of the all bank refresh operation or the per bank refresh operation, only after the refresh command is executed to the last refresh signal, the carry signal CBRincr occurs and the second counting unit 123 counts the refresh command. In the embodiment of the present disclosure, the refresh command in the multi-pulse refresh can be counted through the carry signal CBRincr generated by the signal generation module 101.

Further, according to the second output signal CBRAdd<14:1> for counting the refresh command Ref and the first output signal CBRAdd<0> that is inverted with the refresh signal, the third output signal CBRAdd<14:0> for characterizing a count of the refresh signal generated based on the refresh command Ref can be obtained, thus counting the refresh signal generated based on the refresh command Ref. As the refresh signals each correspond to one refresh address, refresh addresses can also be counted.

It is to be noted that the flip-flop shown in FIG. 7 and FIG. 9 is reset based on a reset signal Reset. The flip-flop outputs the signal based on two consecutive inverters. The two inverters are provided to enhance the driving capability of the output signal without changing the phase and characterized count value of the output signal. In other embodiments, the flip-flop can directly output the signal through the output port Q. Similarly, the flip-flop can also output the signal by connecting an even number (greater than 2) of inverters in series. In some embodiments, the flip-flop may be a D flip-flop, and the inverter may be a logic NOT gate.

Further, for the inversion adjustment signal CBRcountclkmix, the adjustment unit 102 (referring to FIG. 4) is specifically configured to generate the inversion adjustment signal CBRcountclkmix according to the inversion signal CBRcountclk, the first refresh signal (1st pulse) and the first output signal CBRAdd<0>.

Specifically, referring to FIG. 8, the adjustment unit 102 (referring to FIG. 4) includes a NAND gate and an AND gate. The NAND gate includes one input terminal for receiving the first input signal CBRAdd<0>, and the other input terminal for receiving the first refresh signal (1st pulse). The AND gate includes one input terminal connected to an output terminal of the NAND gate, and the other input terminal for receiving the inversion signal CBRcountclk. An output terminal of the NAND gate is configured to output the inversion adjustment signal CBRcountclkmix.

That is, the principles for generating the inversion adjustment signal CBRcountclkmix based on the inversion signal CBRcountclk are as follows: The logic AND gate follows a logic of outputting "1 if all are 1 and 0 if 0 exists". The logic NAND gate follows a logic of outputting "0 if all are 1 and 1 if 0 exists". Referring to FIG. 1, in a normal output time sequence, the inversion signal CBRcountclk corresponding to the first refresh signal (1st pulse) is used to invert the first output signal CBRAdd<0> from the low level to the high level, and the inversion signal CBRcountclk corresponding to the second refresh signal (2nd pulse) is used to invert the first output signal CBRAdd<0> from the high level to the low level. Referring to FIG. 2, in the output time sequence with the second refresh signal (2nd pulse) missing, the inversion signal CBRcountclk corresponding to the first refresh signal (1st pulse) generated based on the current refresh command Ref is used to convert the first output signal CBRAdd<0> from the low level to the high level. However, due to the missing of the second refresh signal (2nd pulse), the first output signal CBRAdd<0> is kept continuously in the high level, the inversion signal CBRcountclk corresponding to the first refresh signal (1st pulse) generated based on the next refresh command Ref is used to invert the first output signal CBRAdd<0> from the high level to the low level, and the inversion signal CBRcountclk corresponding to the second refresh signal (2nd pulse) generated based on the next refresh command Ref is used to invert the first output signal CBRAdd<0> from the low level to the high level, thus causing an output error.

The AND gate is used to generate the inversion adjustment signal CBRcountclkmix according to the inversion signal CBRcountclk when the NAND gate outputs the high level.

For the NAND gate, when the first refresh signal (1st pulse) occurs while the second refresh signal (2nd pulse) is not missing, the first output signal CBRAdd<0> is in the low level, namely the first output signal CBRAdd<0> is in the low level before the first refresh signal (1st pulse) is refreshed. In this case, the NAND gate outputs the high level and generates the inversion adjustment signal CBRcountclkmix for a normal refresh operation. When the first refresh signal (1st pulse) occurs while the second refresh signal (2nd pulse) is missing, the first output signal CBRAdd<0> is in the high level, namely the first output signal CBRAdd<0> is in the high level before the first refresh signal (1st pulse) is refreshed. In this case, the NAND gate outputs the low level and does not generate the inversion adjustment signal CBRcountclkmix, so as to correct a hopping error of the first output signal CBRAdd<0> due to the missing of the second refresh signal (2nd pulse), as shown in FIG. 3. If the first output signal CBRAdd<0> is in the low level, namely the first output signal CBRAdd<0> is in the low level before the first refresh signal (1st pulse) is refreshed, the output time sequence is normal. In this case, the NAND gate outputs the high level and generates the inversion adjustment signal to keep the correct refresh time sequence.

It is to be noted that the logic AND gate may be implemented by connecting an inverter on the output terminal of the NAND gate in actual applications.

The refresh circuit uses the adjustment unit to adjust the time sequence when the second refresh signal is missing. As the second refresh signal of the first refresh command is missing, the refresh circuit only generates the inversion adjustment signal according to the inversion signal corresponding to the second refresh signal for the second refresh command, namely there are one effective carry signal in the first refresh command and the second refresh command, and two effective inversion signals (inversion adjustment signals) to form the refresh process of a normal refresh command, thereby correcting the inversion process of the first output signal and the counting process of the second output signal, and correcting the count of the third output signal.

Figure 10:
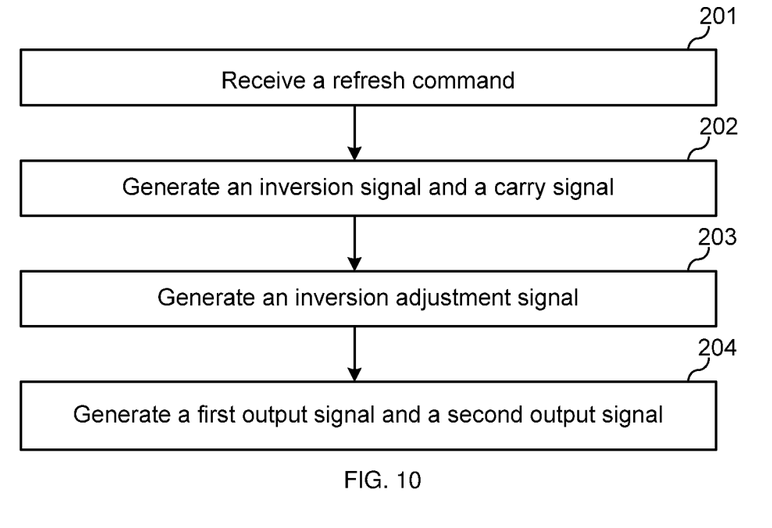
FIG. 10 is a schematic flowchart of a refresh method according to another embodiment of the present disclosure.

Based on the refresh circuit provided by the above embodiment, another embodiment of the present disclosure provides a refresh method. FIG. 10 is a schematic flowchart of a refresh method according to another embodiment of the present disclosure. As shown in FIG. 10, the method mainly includes the following steps:

Step 201: Receive a refresh command.

Specifically, the refresh command is received. The refresh command is used to generate a first refresh signal and a second refresh signal at a time.

Step 202: Generate an inversion signal and a carry signal.

Specifically, the inversion signal is generated based on the first refresh signal, the inversion signal is generated based on the second refresh signal, and the carry signal is generated based on the second refresh signal.

Step 203: Generate an inversion adjustment signal.

Specifically, the inversion adjustment signal is generated based on the inversion signal.

More specifically, if the first refresh signal and the second refresh signal are generated based on a same refresh signal, the inversion signal is synchronized to the inversion adjustment signal. If the second refresh signal generated based on a current refresh command is missing, the inversion adjustment signal is generated according to an inversion signal corresponding to a first refresh signal generated based on a current refresh command, and the inversion adjustment signal is generated only according to an inversion signal corresponding to a second refresh signal generated based on a next refresh command.

Step 204: Generate a first output signal and a second output signal.

Specifically, the first output signal is inverted based on the inversion adjustment signal, and the second output signal is cumulatively added based on the carry signal. Data with the second output signal as a high order and the first output signal as a low order is used to characterize a refresh count based on the refresh command.

In some embodiments, the refresh method further includes: Generate a third output signal according to the first output signal and the second output signal, the third output signal being used to characterize the refresh count based on the refresh command.

In an example, the first output signal is inverted based on the inversion adjustment signal, which includes: Whenever the inversion adjustment signal is received, signal inversion is performed once on a level of a currently outputted first output signal.

In an example, the second output signal is cumulatively added based on the carry signal, which includes: Whenever the carry signal is received, the second output signal is cumulatively added by 1.

As the second refresh signal of the first refresh command is missing, the refresh method only generates the inversion adjustment signal according to the inversion signal corresponding to the second refresh signal for the second refresh command, namely there are one effective carry signal in the first refresh command and the second refresh command, and two effective inversion signals (inversion adjustment signals) to form the refresh process of a normal refresh command Ref, thereby correcting the inversion process of the first output signal and the counting process of the second output signal, and correcting the count of the third output signal.

It is to be noted that the descriptions on the refresh method are similar to those on the refresh circuit in the above embodiment. Therefore, the similar beneficial effects as the refresh circuit in the above embodiment are achieved and will not be repeated herein. Technical details not disclosed in the refresh method in the embodiment of the present disclosure are understood with reference to the descriptions on the refresh circuit in the above embodiment of the present disclosure.

Another embodiment of the present disclosure further provides a semiconductor memory, including the refresh circuit described above. The semiconductor memory in the present disclosure includes but not limited to a DRAM and the like. The semiconductor memory is provided with the refresh circuit in the above embodiment, to count a refresh command, a refresh signal and a refresh address in a multi-pulse refresh.

In some embodiments, the semiconductor memory is a DRAM chip provided with a memory meeting a double data rate 2 (DDR2) memory specification.

In some embodiments, the semiconductor memory is a DRAM chip provided with a memory meeting a DDR3 memory specification.

In some embodiments, the semiconductor memory is a DRAM chip provided with a memory meeting a DDR4 memory specification.

In some embodiments, the semiconductor memory is a DRAM chip provided with a memory meeting a DDR5 memory specification.

It is to be noted that features disclosed in the refresh circuit in the above embodiment may be combined freely without conflicts to obtain a new circuit embodiment, and methods disclosed in the refresh method in the above embodiment may be combined freely without conflict to obtain a new method embodiment.

Those skilled in the art can understand that the above embodiments are specific embodiments for implementing the present disclosure. In practical applications, various changes may be made to the above embodiments in terms of forms and details without departing from the spirit and scope of the present disclosure.

The invention claimed is:

1. A refresh circuit, comprising:
a signal generation module, configured to generate an inversion signal and a carry signal based on a refresh command, wherein the refresh command is used to sequentially generate a first refresh signal and a second refresh signal, the first refresh signal and the second refresh signal each generate the inversion signal, and the carry signal is generated based on the second refresh signal;
an adjustment unit, configured to generate, when the first refresh signal and the second refresh signal are generated based on the refresh command, an inversion adjustment signal according to the inversion signal, and generate, when only the first refresh signal is generated based on the refresh command, the inversion adjustment signal according to an inversion signal corresponding to a first refresh signal generated based on a current refresh command, and generate the inversion adjustment signal only according to an inversion signal corresponding to a second refresh signal generated based on a next refresh command; and
a counting module, configured to generate a first output signal and a second output signal, and invert the first output signal based on the inversion adjustment signal, and cumulatively add the second output signal based on the carry signal, wherein data with the second output signal as a high order and the first output signal as a low order is used to characterize a refresh count based on the refresh command.

2. The refresh circuit according to claim 1, wherein the counting module comprises:
a first counting unit, configured to generate the first output signal, and invert the first output signal based on the inversion adjustment signal;
a second counting unit, configured to generate the second output signal, and cumulatively add the second output signal based on the carry signal; and
an output unit, connected to the first counting unit and the second counting unit, and configured to output a third output signal according to the first output signal and the second output signal, the third output signal being used to characterize the refresh count based on the refresh command.

3. The refresh circuit according to claim 2, wherein the first counting unit is specifically configured to: output a digital high-level signal or a digital low-level signal, wherein whenever receiving the inversion adjustment signal, the first counting unit performs signal inversion once on a level of the digital high-level signal or the digital low-level signal currently output by the first counting unit.

4. The refresh circuit according to claim 3, wherein the first counting unit comprises a flip-flop and multiple inverters; an output port Q of the flip-flop is connected to an input terminal of a inverter; an output terminal of the inverter is connected to an input port D of the flip-flop; a clock port CLK of the flip-flop is configured to receive the inversion adjustment signal; and the output port Q of the flip-flop is configured to output the first output signal.

5. The refresh circuit according to claim 2, wherein the second counting unit comprises multiple flip-flops and multiple inverters; an output port Q of a low-order flip-flop is connected to a clock port CLK of a high-order flip-flop; an output port Q of each the flip-flop is respectively connected to an input terminal of a inverter; an output terminal of the inverter is respectively connected to input ports D of the flip-flops; a clock port CLK of a lowest-order flip-flop is configured to receive the carry signal; and the output port Q of each the flip-flop is jointly configured to output the second output signal.

6. The refresh circuit according to claim 1, wherein the adjustment unit is specifically configured to generate the inversion adjustment signal according to the inversion signal, the first refresh signal and the first output signal.

7. The refresh circuit according to claim 6, wherein the adjustment unit comprises a NAND gate and an AND gate;
the NAND gate comprises one input terminal for receiving the first output signal, and the other input terminal for receiving the first refresh signal;
the AND gate comprises one input terminal connected to an output terminal of the NAND gate, and the other input terminal for receiving the inversion signal; and
an output terminal of the AND gate is configured to output the inversion adjustment signal.

8. The refresh circuit according to claim 1, wherein the signal generation module comprises:
a first signal generation unit, configured to generate the inversion signal according to the first refresh signal and the second refresh signal; and
a second signal generation unit, configured to generate the carry signal according to the second refresh signal.

9. A refresh method, applied to the refresh circuit according to claim 1, and comprising:
receiving the refresh command, wherein the refresh command is used to sequentially generate the first refresh signal and the second refresh signal;
generating the inversion signal based on the first refresh signal, generating the inversion signal based on the second refresh signal, and generating the carry signal based on the second refresh signal;
generating the inversion adjustment signal based on the inversion signal; and
inverting the first output signal based on the inversion adjustment signal, and cumulatively adding the second output signal based on the carry signal, wherein the data with the second output signal as the high order and the first output signal as the low order is used to characterize the refresh count based on the refresh command.

10. The refresh method according to claim 9, wherein the generating the inversion adjustment signal based on the inversion signal comprises: synchronizing the inversion signal to the inversion adjustment signal when the first refresh signal and the second refresh signal are generated based on a same refresh command.

11. The refresh method according to claim 10, wherein when the second refresh signal generated based on the current refresh command is missing, the inversion adjustment signal is generated according to the inversion signal corresponding to the first refresh signal generated based on the current refresh command, and the inversion adjustment signal is generated only according to the inversion signal corresponding to the second refresh signal generated based on the next refresh command.

12. The refresh method according to claim 9, wherein the inverting the first output signal based on the inversion adjustment signal comprises: performing, whenever receiving the inversion adjustment signal, signal inversion once on a level of a currently outputted first output signal.

13. The refresh method according to claim 9, wherein the cumulatively adding the second output signal based on the carry signal comprises: cumulatively adding the Second output signal by 1 whenever receiving the carry signal.

14. A semiconductor memory, comprising the refresh circuit according to claim 1.

15. The semiconductor memory according to claim 14, wherein the semiconductor memory is a dynamic random access memory (DRAM) chip.

* * * * *